США011209487B2

United States Patent
Kato et al.

(10) Patent No.: US 11,209,487 B2
(45) Date of Patent: Dec. 28, 2021

(54) ROTOR DIAGNOSTIC APPARATUS, ROTOR DIAGNOSTIC METHOD, AND ROTOR DIAGNOSTIC PROGRAM

(71) Applicant: HITACHI, LTD., Tokyo (JP)

(72) Inventors: Tetsuji Kato, Tokyo (JP); Kohji Maki, Tokyo (JP); Minori Nagata, Tokyo (JP)

(73) Assignee: HITACHI, LTD., Tokyo (JP)

( * ) Notice: Subject to any disclaimer, the term of this patent is extended or adjusted under 35 U.S.C. 154(b) by 340 days.

(21) Appl. No.: 16/308,543

(22) PCT Filed: Mar. 27, 2017

(86) PCT No.: PCT/JP2017/012473
§ 371 (c)(1),
(2) Date: Dec. 10, 2018

(87) PCT Pub. No.: WO2017/217069
PCT Pub. Date: Dec. 21, 2017

(65) Prior Publication Data
US 2019/0146036 A1    May 16, 2019

(30) Foreign Application Priority Data
Jun. 13, 2016 (JP) .............................. JP2016-116962

(51) Int. Cl.
*G01R 31/34* (2020.01)
*G01H 17/00* (2006.01)
(Continued)

(52) U.S. Cl.
CPC ........... *G01R 31/343* (2013.01); *G01H 17/00* (2013.01); *G01M 13/028* (2013.01); *G05B 23/02* (2013.01)

(58) Field of Classification Search
CPC ...... G01R 31/343; G01H 17/00; G05B 23/02; G01M 13/028
See application file for complete search history.

(56) References Cited

U.S. PATENT DOCUMENTS

2011/0089882 A1*  4/2011  Yeh ....................... G01R 31/343
                                                              318/490
2012/0185813 A1*  7/2012  Kaushal ........... G05B 19/41875
                                                              716/112
(Continued)

FOREIGN PATENT DOCUMENTS

CN  101799524 A * 8/2010 ............... G01S 1/02
JP  61-151478 A   7/1986
(Continued)

OTHER PUBLICATIONS

International Search Report of PCT/JP2017/012473 dated May 16, 2017.
(Continued)

*Primary Examiner* — Tarun Sinha
*Assistant Examiner* — Lal C Mang
(74) *Attorney, Agent, or Firm* — Mattingly & Malur, PC

(57) ABSTRACT

A rotor diagnostic apparatus includes a parameter selection part that calculates evaluation values indicating how much sensor values of a rotor at a given time point deviate from a reference value at which the rotor is known to be in a normal state, the given time point being after the rotor is known to be in the normal state and before the rotor is to be diagnosed, and selects a plurality of parameters to be used for abnormality diagnosis of the rotor from the sensor values based on the calculated evaluation values. A diagnosis part outputs an abnormality value which is indicative of how abnormal the rotor is and which is obtained based on a distance, in a multidimensional space having the selected parameters as coordinate axes, between a figure represented by sensor values in the normal state and a figure represented by sensor values targeted for diagnosis.

7 Claims, 10 Drawing Sheets

(51) Int. Cl.
G05B 23/02 (2006.01)
G01M 13/028 (2019.01)

(56) References Cited

U.S. PATENT DOCUMENTS

2015/0347213 A1* 12/2015 Oh .................... G05B 23/0235
714/37
2017/0082692 A1* 3/2017 Mulay .................... G01R 31/34

FOREIGN PATENT DOCUMENTS

| JP | 2005-241089 | A | | 9/2005 | | |
|----|----|----|----|----|----|----|
| JP | 2008-536219 | A | | 9/2008 | | |
| JP | 2009-040290 | A | | 2/2009 | | |
| JP | 2014-015746 | A | | 1/2014 | | |
| JP | 2016-091417 | A | | 5/2016 | | |
| JP | 2016091417 | A | * | 5/2016 | ............ | G05B 23/02 |
| JP | 2017-76289 | W | | 4/2017 | | |
| WO | 2006/110246 | A3 | | 10/2006 | | |
| WO | WO-2016072240 | A1 | * | 5/2016 | ............ | G01C 21/26 |

OTHER PUBLICATIONS

Japanese Office Action received in corresponding Japanese Application No. 2018-523331 dated Jun. 2, 2020.

* cited by examiner

FIG.3

| TIME POINT ID | TIME POINT | SUMMARY | SENSOR VALUES 1 | | | | SENSOR VALUES 2 | | | | ... |
| --- | --- | --- | --- | --- | --- | --- | --- | --- | --- | --- | --- |
| | | | PRE-PROCESSING | POST-PROCESSING 1 | POST-PROCESSING 2 | POST-PROCESSING 3 | ... | PRE-PROCESSING | POST-PROCESSING 1 | POST-PROCESSING 2 | POST-PROCESSING 3 | ... |
| $t_1$ | 20150325 10:30:00 | SHIPPED FROM FACTORY, OPERATION STARTS | $p_{10}$ | $P_{11}$ | $P_{12}$ | $P_{13}$ | ... | $q_{10}$ | $Q_{11}$ | $Q_{12}$ | $Q_{13}$ | ... |
| $t_2$ | 20150325 10:40:00 | | $p_{20}$ | $P_{21}$ | $P_{22}$ | $P_{23}$ | ... | $q_{20}$ | $Q_{21}$ | $Q_{22}$ | $Q_{23}$ | ... |
| $t_3$ | 20150325 10:50:00 | | $p_{30}$ | $P_{31}$ | $P_{32}$ | $P_{33}$ | ... | $q_{30}$ | $Q_{31}$ | $Q_{32}$ | $Q_{33}$ | ... |
| ... | ... | | ... | ... | ... | | ... | ... | ... | ... | ... | ... |
| $t_{s-2}$ | 20150825 14:40:00 | | | | | | ... | | | | | ... |
| $t_{s-1}$ | 20150825 14:50:00 | RIGHT BEFORE MAINTENANCE AND INSPECTION | | | | | ... | | | | | ... |
| $t_s$ | 20150825 15:00:00 | | $p_{s0}$ | $P_{s1}$ | $P_{s2}$ | $P_{s3}$ | ... | $q_{s0}$ | $Q_{s1}$ | $Q_{s2}$ | $Q_{s3}$ | ... |
| ... | 20150901 10:00:00 | OPERATION RESUMES AFTER MAINTENANCE AND INSPECTION | | | | | ... | | | | | ... |
| ... | 20150901 10:10:00 | | | | | | ... | | | | | ... |
| ... | 20150901 10:20:00 | | | | | | ... | | | | | ... |
| ... | ... | | ... | ... | ... | | ... | ... | ... | ... | ... | ... |
| $t_{n-2}$ | 20160425 12:30:00 | | | | | | ... | | | | | ... |
| $t_{n-1}$ | 20160425 12:40:00 | | | | | | ... | | | | | ... |
| $t_n$ | 20160425 12:50:00 | DIAGNOSIS TARGET TIME POINT | $p_{n0}$ | $P_{n1}$ | $P_{n2}$ | $P_{n3}$ | ... | $q_{n0}$ | $Q_{n1}$ | $Q_{n2}$ | $Q_{n3}$ | ... |

DETAILS OF STEP S34

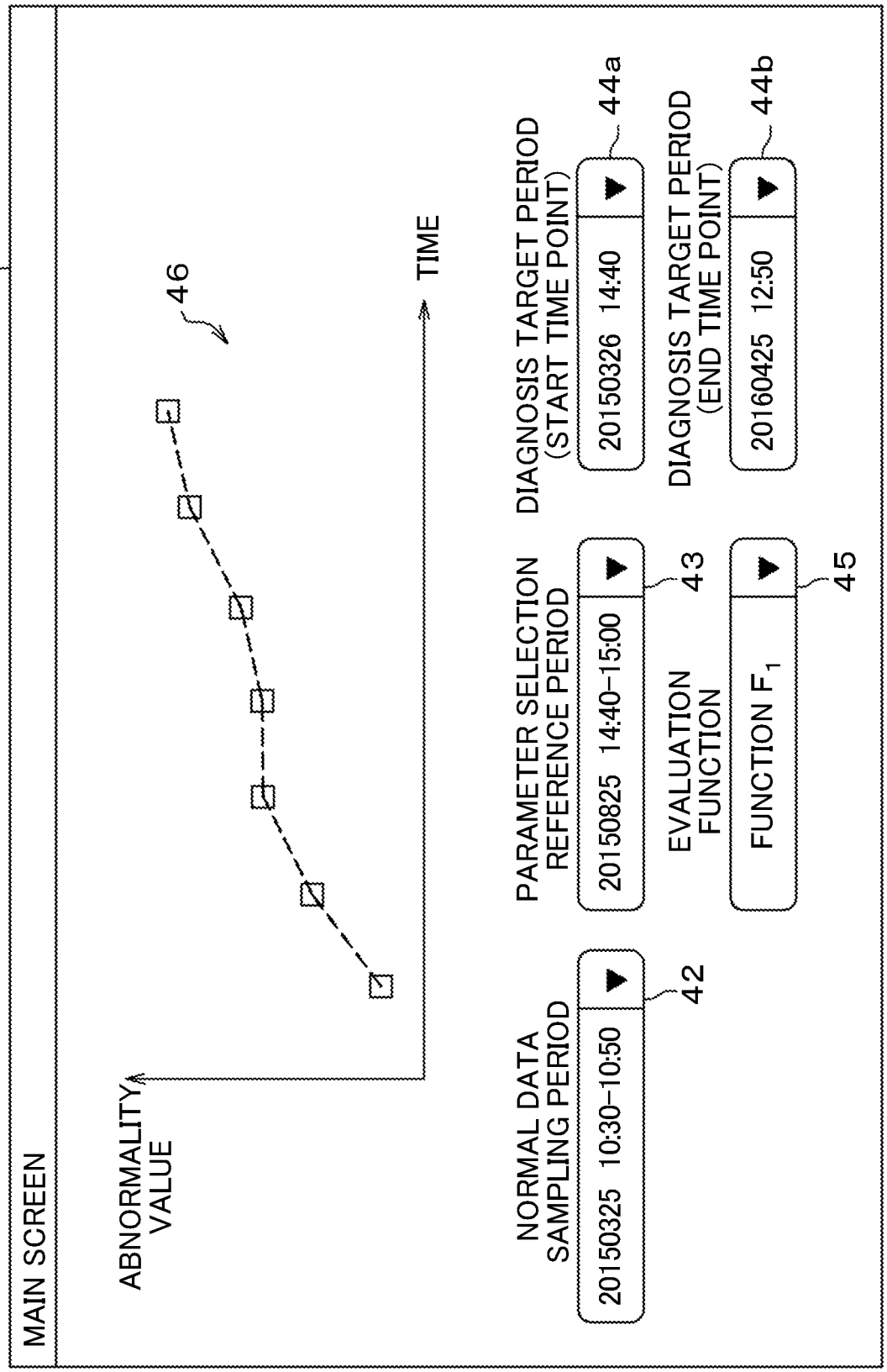

ROTOR DIAGNOSTIC APPARATUS, ROTOR DIAGNOSTIC METHOD, AND ROTOR DIAGNOSTIC PROGRAM

TECHNICAL FIELD

The present invention relates to a rotor diagnostic apparatus, a rotor diagnostic method, and a rotor diagnostic program.

BACKGROUND ART

As representative examples of rotors, there are an electric motor as a power source and a power generator that generates power to be supplied to an electric motor. When a rotor is installed in a large-scale production facility or the like, a sudden failure of the rotor inevitably requires large-scale repair and replacement work. This leads to decrease in the rate of operation of the production facility or the like or necessity to review the production plan and the like. Thus, it is important to carry out predictive diagnosis to detect a sign of a failure of a rotor before the failure of the rotor actually happens. Such predictive diagnosis includes offline diagnosis carried out with the rotor temporarily stopped and online diagnosis carried out with the rotor rotating.

The offline diagnosis naturally decreases the rate of operation of the production facility or the like. Moreover, there are types of deterioration of a rotor that are evident only when the rotor is rotating. Thus, recently, there are greater needs for online diagnosis. Before a failure of a rotor becomes serious, a sign signaled from the rotor is faint. Various techniques are widespread to detect such a faint signal precisely. An equipment diagnosing apparatus in Patent Literature 1 places a point representing multidimensional normal data and a point representing multidimensional diagnostic data in a multidimensional space, and calculates the distance between these points. Then, based on the length of the distance calculated, the equipment diagnosing apparatus determines whether the diagnostic data is abnormal.

CITATION LIST

Patent Literature

Patent Literature 1: Japanese Patent Application Publication No. 2005-241089

SUMMARY OF INVENTION

Technical Problem

Predictive diagnosis may use various kinds of sensor values measured in a rotor. Examples of such sensor values include rotational speed, the number of vibrations, current, voltage, and sound. Also, not only sensor values directly measured by sensors, but also sensor values that are processed (by signal processing) may be used. An example of the signal processing is Fourier transform. While there are various types of sensor values before processing and sensor values after processing (signal processing), sensor values that are actually used in predictive diagnosis are referred to as "parameters". The precision of predictive diagnosis greatly depends on the selection of the parameters. There are parameters that actually barely contribute to the diagnosis results (normality/abnormality). Whether a certain parameter contributes to the diagnosis results changes dependent on the environment and the age of the rotor as well.

Thus, it is difficult to objectively select parameters that contribute to the diagnosis results prior to the predictive diagnosis, and in many sites, parameters are selected relying on the knowledge of experienced technicians. Alternatively, typical textbook parameters are selected uniformly, irrespective of specific characteristics of the rotor. Patent Literature 1 also assumes that parameters are selected relying on the knowledge of technicians. Thus, the present invention aims to select parameters that contribute to diagnosis results according to the characteristics of a rotor, without relying on an individual's knowledge and skills.

Solution to Problem

A rotor diagnostic apparatus of the present invention comprises: a parameter selection part that calculates evaluation values each indicative of how much sensor values of a rotor at a given time point deviate from a reference value at a time point at which the rotor is known to be in a normal state, the given time point being after the time point at which the rotor is known to be in the normal state and before a time point at which the rotor is to be diagnosed, and selects a plurality of parameters to be used for abnormality diagnosis of the rotor from the sensor values based on the calculated evaluation values; and a diagnosis part that displays, in a multidimensional space having the selected plurality of parameters as coordinate axes, a first figure represented by the sensor values corresponding to the selected plurality of parameters at the time point at which the rotor is known to be in the normal state, and a second figure represented by the sensor values corresponding to the selected plurality of parameters at the time point at which the rotor is to be diagnosed, and outputs an abnormality value indicative of how abnormal the rotor is, the abnormality value being based on a distance between the first figure and the second figure displayed.

Other means will be described in DESCRIPTION OF EMBODIMENTS.

Advantageous Effects of Invention

The present invention can select parameters that contribute to diagnosis results according to the characteristics of a rotor, without relying on an individual's knowledge and skills.

BRIEF DESCRIPTION OF DRAWINGS

FIG. 3 is an example of a sensor values database.

FIG. 8 is a diagram illustrating an example of a main screen.

DESCRIPTION OF EMBODIMENTS

An embodiment of the present invention (hereinafter referred to as the present embodiment) will be described in detail with reference to the drawings and the like.

Specifically, a description is given of an example where a rotor diagnostic apparatus carries out predictive diagnosis of an electric motor.

(Configuration of the Rotor Diagnostic Apparatus)

Figure 1:
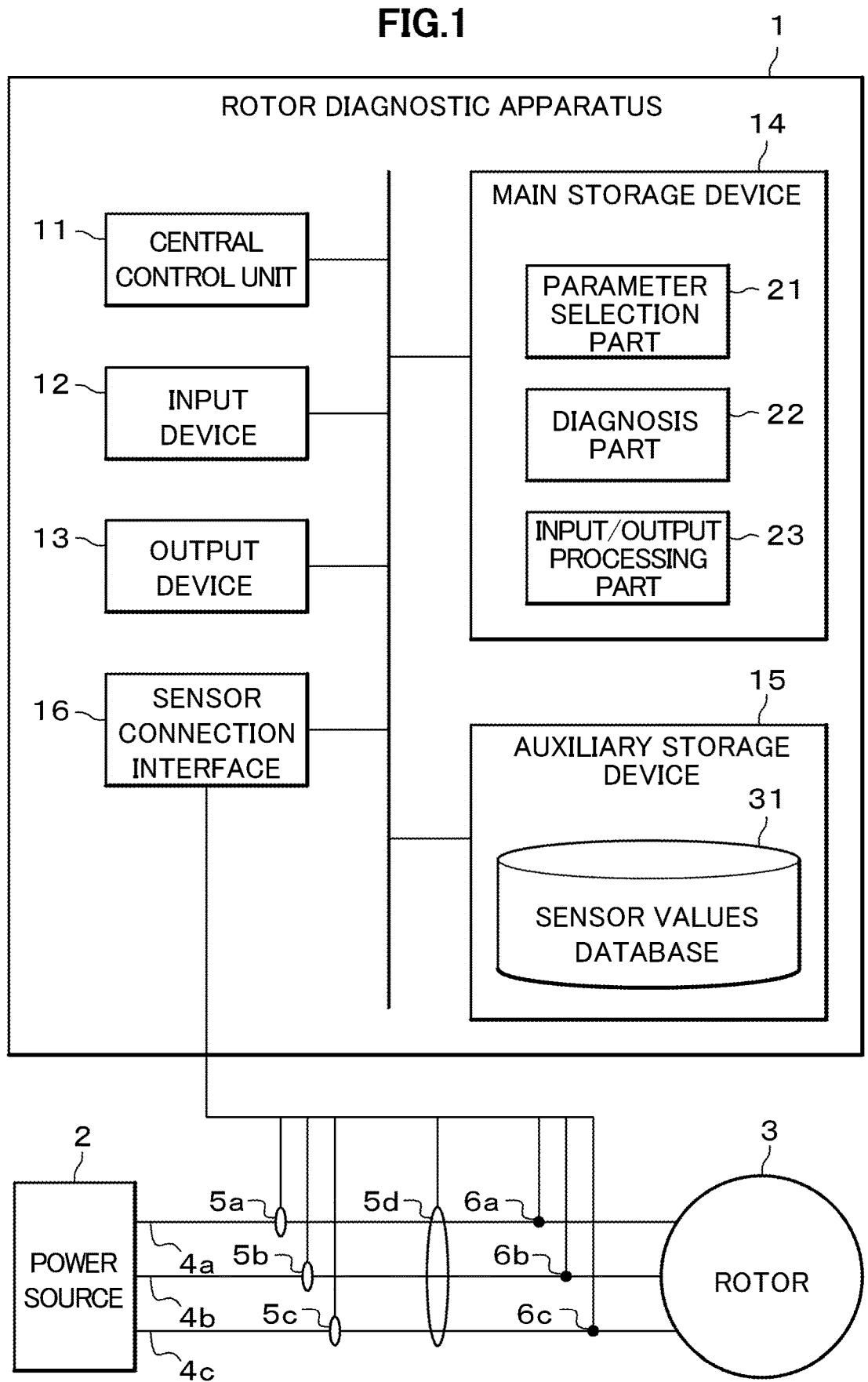
FIG. 1 is a diagram illustrating a configuration of a rotor diagnostic apparatus and sensor arrangement.

With reference to FIG. 1, the configuration of the rotor diagnostic apparatus and sensor arrangement are described. A rotor diagnostic apparatus 1 is a typical computer. The rotor diagnostic apparatus 1 has a central control unit 11, an input device 12, an output device 13, a main storage device 14, an auxiliary storage device 15, and a sensor connection interface 16. They are connected by a bus. The auxiliary storage device 15 stores a sensor values database 31 (to be described in detail later). A parameter selection part 21, a diagnosis part 22, and an input/output processing part 23 in the main storage device 14 are programs. In the following descriptions, when a certain part is described as the subject of an action, it means that the central control unit 11 reads the certain part from the auxiliary storage device 15, loads the certain part onto the main storage device 14, and executes a function of the certain part (to be described in detail below).

(Sensor Arrangement)

A power source 2 provides a rotor 3 with three-phase AC power. The power passes through three feeder lines for the respective phases. They are feeder lines 4a, 4b, and 4c. The sensor connection interface 16 of the rotor diagnostic apparatus 1 of the present embodiment is connected to current sensors 5a, 5b, 5c, and 5d and voltage sensors 6a, 6b, and 6c. The current sensors 5a, 5b, and 5c are disposed in such a way as to surround the feeder lines 4a, 4b, and 4c, respectively, and measure the respective phase currents. The current sensor 5d is disposed in such a way as to surround the feeder lines 4a, 4b, and 4c, and measures a zero-phase current. Conceivable types of the current sensors include, but are not limited to, a penetration type, a clamp type, a split type, and an optical-fiber type.

The voltage sensors 6a, 6b, and 6c are for example voltage probes, and detect voltages (potentials) of the feeder lines 4a, 4b, and 4c, respectively, convert the voltages to low-voltage signals, and transmit the signals to the rotor diagnostic apparatus 1. Based on the signals received, the rotor diagnostic apparatus 1 calculates the phase voltages of the feeder lines 4a, 4b, and 4c. Note that there are times when it is known that the rotor 3 is in a normal state and times when it is unknown whether the rotor 3 is in a normal state.

(Signal Processing on a Sensor Value)

Figure 2A:
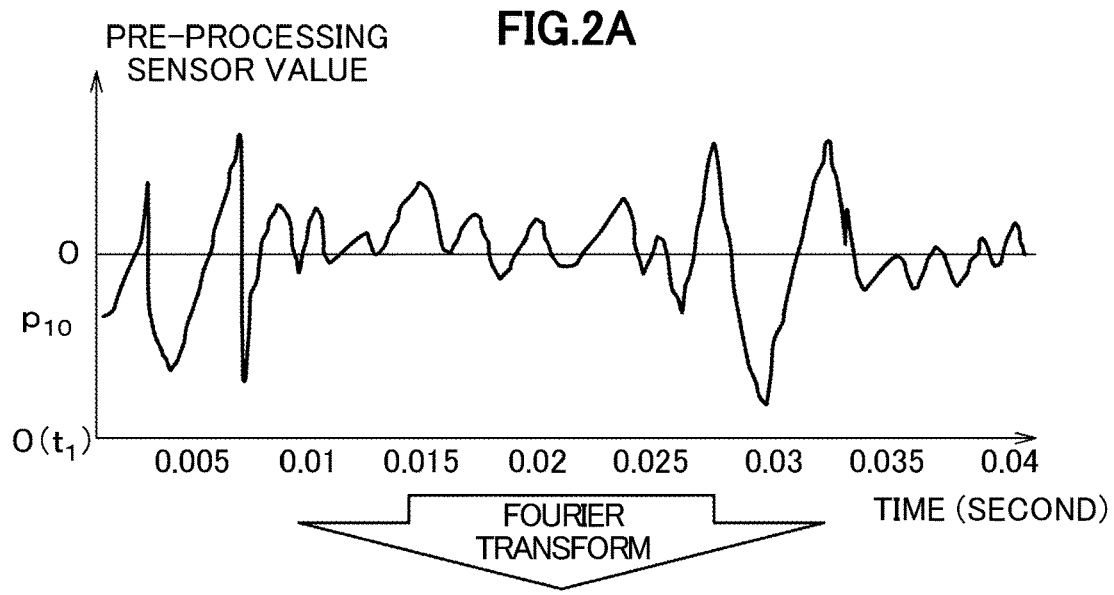
FIGS. 2A, 2B, and 2C are each a diagram illustrating signal processing performed on a sensor value.

FIG. 2A shows a time-series waveform of given sensor values. The vertical axis of the waveform represents sensor values directly measured by a sensor, and such sensor values are referred to as "pre-processing sensor values". The pre-processing sensor value is $p_{10}$ at a time point $t_1$. The rotor diagnostic apparatus 1 performs signal processing (Fourier transform) on a very short period (0.04 seconds in FIG. 2A) starting from the time point $t_1$. The horizontal axis of the Fourier-transformed waveform represents frequency. The vertical axis (amplitude spectrum) differs depending on the physical quantity of the pre-processing sensor value, but is referred to as a "post-processing sensor value" herein.

Generally, there are various ways of selecting which value of the post-processing sensor values to use. The following gives two examples.

Figure 2B:
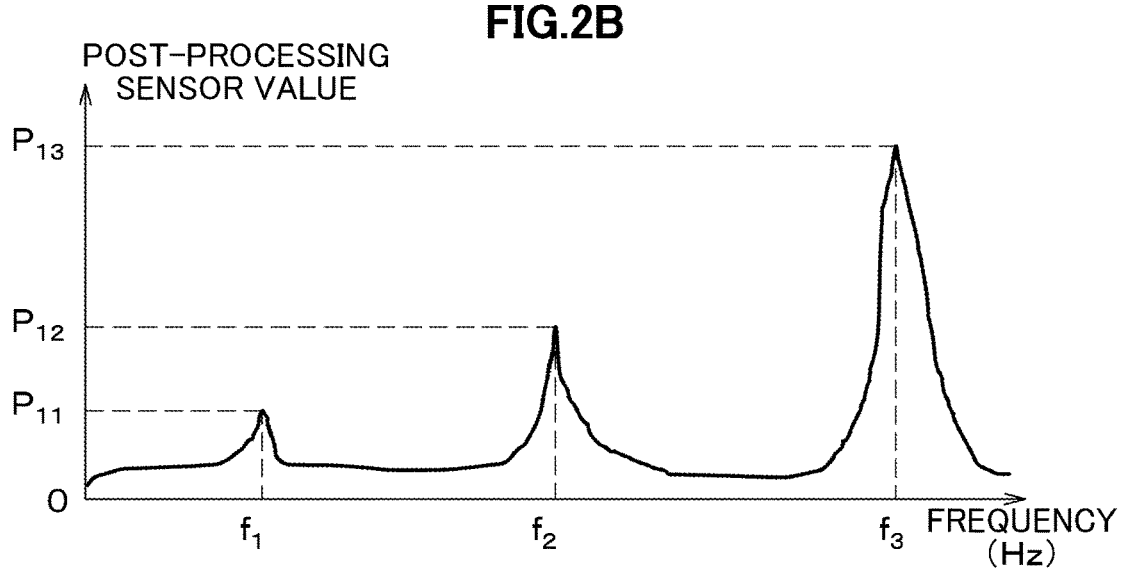

In FIG. 2B, the rotor diagnostic apparatus 1 acquires peak values of the post-processing sensor values. Post-processing sensor values $P_{11}$, $P_{12}$, $P_{13}$ are peak values, and these peak values correspond to frequencies $f_1$, $f_2$, and $f_3$, respectively. In this case, it may be unknown exactly what the frequencies corresponding to the respective peak values mean. It is dependent on the original waveform as to at which frequency a post-processing signal value shows a peak value. Thus, for example, the frequency at which a post-processing sensor value shows a peak value at a time point $t_2$ is not necessarily the same as the frequency at which a post-processing sensor value shows a peak value at the time point $t_1$. In other words, the second indices "1", "2", and "3" in $P_{11}$, $P_{12}$, and $P_{13}$ in FIG. 2B indicate the increasing order of frequency.

Figure 2C:
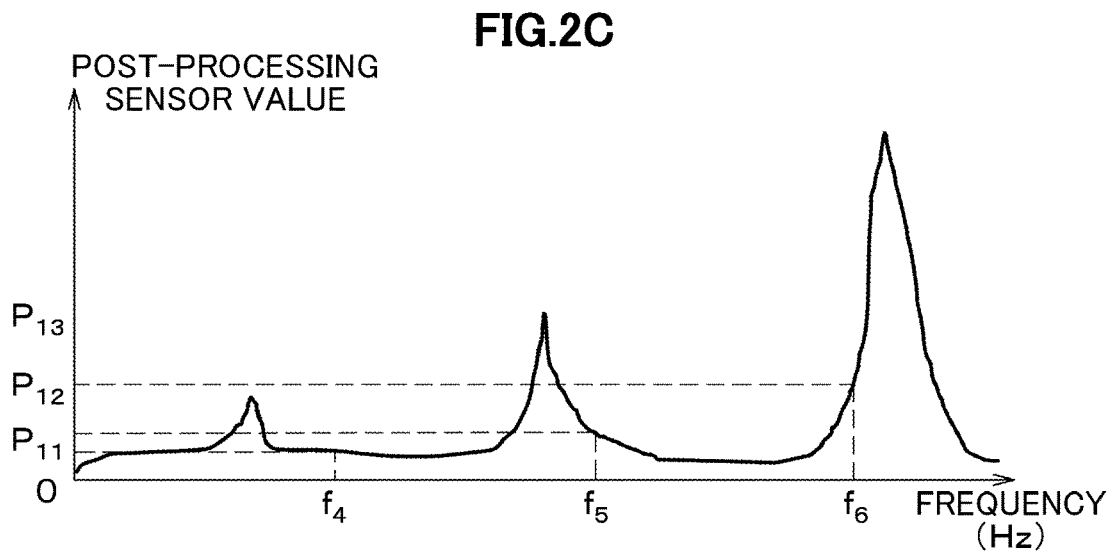

In FIG. 2C, the rotor diagnostic apparatus 1 acquires, from the post-processing sensor values, ones corresponding to particular frequencies. For example, assume that it has been found that the post-processing sensor values at frequencies $f_4$, $f_5$, and $f_6$ are decisively important for abnormality detection. Then, the rotor diagnostic apparatus 1 acquires post-processing sensor values $P_{11}$, $P_{12}$, and $P_{13}$ at the frequencies $f_4$, $f_5$, and $f_6$ at respective time points. $P_{11}$, $P_{12}$, $P_{13}$ are not necessarily peak values. In other words, the second indices "1", "2", and "3" in $P_{11}$, $P_{12}$, and $P_{13}$ in FIG. 2C indicate particular frequencies.

(Sensor Values Database)

The sensor values database 31 is described with reference to FIG. 3. In the sensor values database 31, data is stored in association with a time point ID stored in a time point ID column 101, the data being a time point in a time point column 102, a summary in a summary column 103, values in sub-columns 104a, 104b, 104c, 104d, . . . of a sensor values 1 column 104, and values in sub-columns 105a, 105b, 105c, 105d, . . . of sensor values 2 column 105.

The time point ID in the time point ID column 101 is an identifier that uniquely identifies a time point.

The time point in the time point column 102 is a date (year, month, and day) and time (hour, minute, and second) indicating when sensors measured their sensor values.

The summary in the summary column 103 is memorandum information such as a history of operation of the rotor.

The sensor values 1 column 104 has sub-columns: a pre-processing column 104a, a post-processing 1 column 104b, a post-processing 2 column 104c, a post-processing 3 column 104d, . . . . Now focusing on the first record in the sensor values database 31, "$p_{10}$" stored in the pre-processing column 104a is "$p_{10}$" in FIG. 2A, "$P_{11}$" in the post-processing 1 column 104b is "$P_{11}$" in FIG. 2B or 2C, "$P_{12}$" in the post-processing 2 column 104c is "$P_{12}$" in FIG. 2B or 2C, and "$P_{13}$" in the post-processing 3 column 104d is "$P_{13}$" in FIG. 2B or 2C. In FIG. 2B or 2C, as the number of post-processing sensor values acquired increases, a post-processing 4 column, a post-processing 5 column, . . . are added. The same applies to the second and following records.

The description for the sensor values 1 column 104 applies to the sensor values 2 column 105. The sensor values database 31 has the sensor values 1 column, the sensor values 2 column, the sensor values 3 column, . . . as many as the sensors. FIG. 1 shows seven sensors in total. In this case, the sensor values database 31 has a sensor values 1 column, a sensor values 2 column, a sensor values 3 column, . . . and a sensor values 7 column.

There is one sensor values database 31 for every rotor, and the number of records (or rows) in one sensor values database 31 equals the number of time points at which sensor values were measured.

From FIG. 3 overall, the following is found.

At 10:30:00 on Mar. 25, 2015, the rotor 3 starts its operation after being shipped from a factory.

At 15:00:00 on Aug. 25, 2015, the rotor 3 stops its operation temporarily for maintenance and inspection. There are naturally occasions where operation of the rotor 3 is stopped according to regular operation schedule, but such occasions are omitted here.

At 10:00:00 on Sep. 1, 2015, the rotor 3 resumes its operation after the maintenance and inspection.

At 12:50:00 on Apr. 25, 2016, the rotor 3 is still running. At this time point, a user of the rotor diagnostic apparatus 1 tries to run a diagnosis on the rotor 3 with the rotor 3 running.

(Processing Procedure)

Figure 4:
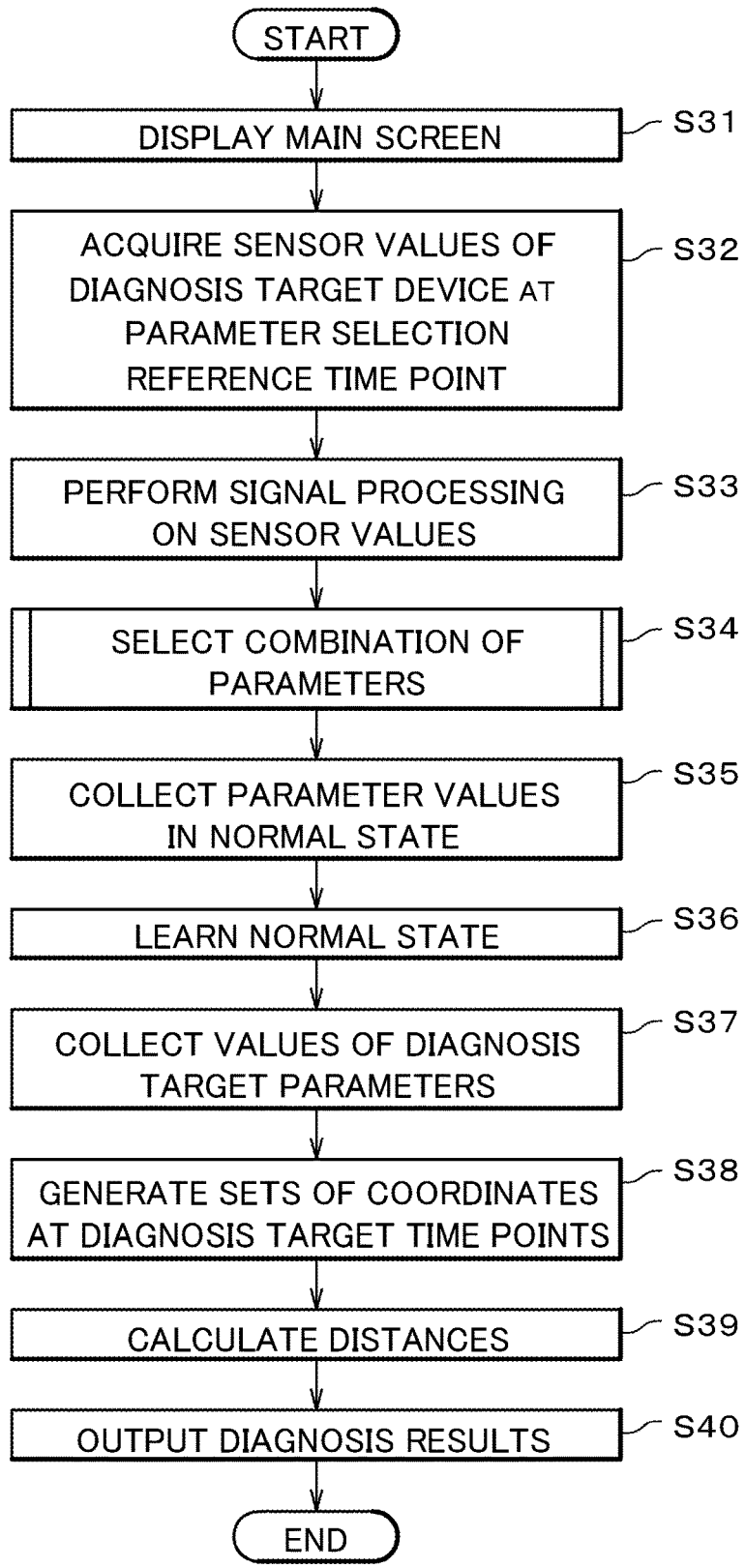
FIG. 4 is a flowchart of a processing procedure.

A processing procedure is described with reference to FIG. 4 and to FIG. 8 and other drawings where necessary. It is assumed that, before the following processing starts, the auxiliary storage device 15 already stores the sensor values database 31 as shown in FIG. 3, with the post-processing columns 104b, 104c, 104d, . . . , 105b, 105c, 105d, . . . being blank.

In Step S31, the input/output processing part 23 of the rotor diagnostic apparatus 1 displays a main screen 41 (FIG. 8). Specifically, in a first stage, the input/output processing part 23 displays the main screen 41 on the output device 13.

In a second stage, the input/output processing part 23 receives a normal data sampling period (to be described immediately below) inputted by the user into a normal data sampling period field 42.

In a third stage, the input/output processing part 23 receives a start time point of a diagnosis target period (to be described immediately below) and an end time point of the diagnosis target period inputted by the user into a diagnosis target period (start time point) field 44a and a diagnosis target period (end time point) field 44b, respectively.

In a fourth stage, the input/output processing part 23 receives a parameter selection reference period (to be described immediately below) inputted by the user into a parameter selection reference period field 43.

(Normal Data Sampling Period, Diagnosis Target Period, and Parameter Selection Reference Period)

The normal data sampling period is a period including a time point at which it is known that the rotor to be diagnosed (hereinafter also referred to as a diagnosis target device) is normal. For example, a time point immediately after the diagnosis target device is shipped from a factory is included in the normal data sampling period.

The diagnosis target period is a period including a time point which is some time after the diagnosis target device started its operation and at which the user is not sure about whether the diagnosis target device is in a normal state. A past time point other than the current time point may be included in the diagnosis target period (ex-post diagnosis).

The parameter selection reference period is a period including any time point at which it is likely that deterioration of the diagnosis target device has progressed to some extent, the time point being anywhere between the time point at which the rotor is known to be in a normal state and the diagnosis target time point. The following are example time points included in the parameter selection reference period:

time point immediately before the diagnosis target device broke in the past, time point immediately before the diagnosis target device was subjected to maintenance and inspection in the past (e.g., time point $t_s$ in FIG. 3), and time point at which the diagnosis target device has more or less deteriorated from a normal state.

As the normal data sampling period, the user may input one time point included in the normal data sampling period. The same applies to the diagnosis target period and the parameter selection reference period. In these cases, considering the duration of time, the normal data sampling period and the like may be read as a "normal data sampling time point" and the like. The temporal order of these time points are, from early to late temporally, the normal data sampling time point, the parameter selection reference time point, and the diagnosis target time point.

The following description assumes that the user makes the following inputs:

time points $t_1$, $t_2$, and $t_3$ in FIG. 3 as a normal data sampling period, time points $t_{n-2}$, $t_{n-1}$, and $t_n$ in FIG. 3 as a diagnosis target period, and time point $t_s$ in FIG. 3 as a parameter selection reference time point (which happens to be not a period).

In Step S32, the parameter selection part 21 of the rotor diagnostic apparatus 1 acquires sensor values of the diagnosis target device at the parameter selection reference time point. Specifically, the parameter selection part 21 acquires all the sensor values in the record of the parameter selection reference time point is among the records in the sensor values database 31. If the user does not input a parameter selection reference period (or time point) (or does think of any), the parameter selection part 21 may acquire data simulating deterioration of the diagnosis target device.

In Step S33, the parameter selection part 21 performs signal processing on the sensor values. Specifically, the parameter selection part 21 performs signal processing (Fourier transform) on the sensor values acquired in Step S32. Assume here that there are p, q, r, v, and w as pre-processing sensor values. Then, the parameter selection part 21 acquires $P_{s1}$, $P_{s2}$, $P_{s3}$, . . . as post-processing sensor values of $p_{s0}$. Similarly, the parameter selection part 21 acquires $Q_{s1}$, $Q_{s2}$, $Q_{s3}$, . . . from $q_{s0}$, acquires $R_{s1}$, $R_{s2}$, $R_{s3}$, . . . from $r_{s0}$, acquires $V_{s1}$, $V_{s2}$, $V_{s3}$, from $v_{s0}$, and acquires $W_{s1}$, $W_{s2}$, $W_{s3}$, . . . from $w_{s0}$. Note that Fourier transform is signal processing on a time-series waveform in a very short period. Thus, more precisely, "acquiring . . . from $p_{s0}$" means "acquiring . . . from a waveform in a very short period following the time point corresponding to $p_{s0}$" (the same applies below).

In Step S34, the parameter selection part 21 selects a combination of parameters. Step S34 will be detailed later. Assume that as a result the parameter selection part 21 selects, for example, three parameters: $P_{s1}$, $Q_{s2}$, and $R_{s3}$.

In Step S35, the diagnosis part 22 of the rotor diagnostic apparatus 1 collects values of the parameters in a normal state. Specifically, in a first stage, the diagnosis part 22 acquires pre-processing sensor values $p_{10}$, $q_{10}$, $r_{10}$, $p_{20}$, $q_{20}$, $r_{20}$, $p_{30}$, $q_{30}$, and $r_{30}$ from the records for the time points $t_1$, $t_2$, and $t_3$ included in the normal data sampling period in the sensor values database 31. These correspond to $P_{s1}$, $Q_{s2}$, and $R_{s3}$ selected in Step S34.

In a second stage, the diagnosis part 22 acquires $P_{11}$ by performing signal processing (Fourier transform) on $p_{10}$, acquires $P_{21}$ by performing signal processing on $p_{20}$, and acquires $P_{31}$ by performing signal processing on $p_{30}$. Similarly, the diagnosis part 22 acquires $Q_{12}$ by performing signal processing on $q_{10}$, acquires $Q_{22}$ by performing signal processing on $q_{20}$, and acquires $Q_{32}$ by performing signal processing on $q_{30}$. Similarly, the diagnosis part 22 acquires $R_{13}$ by performing signal processing on $r_{10}$, acquires $R_{23}$ by performing signal processing on $r_{20}$, and acquires $R_{33}$ by performing signal processing on $r_{30}$.

In Step S36, the diagnosis part 22 learns a normal state. Specifically, in a first stage, the diagnosis part 22 sets a multidimensional space (see FIG. 6). The number of dimensions of the multidimensional space equals the number of parameters selected in Step S34 ("three" in the above example).

In a second stage, the diagnosis part 22 assigns the parameters selected in Step S34 to the respective coordinate axes of the multidimensional space. In the above example, the diagnosis part 22 assigns $P_{s1}$ to the first axis (PARAMETER 1 in FIG. 6), assigns $Q_{s2}$ to the second axis (PARAMETER 2 in FIG. 6), and assigns $R_{s3}$ to the third axis (PARAMETER 3 in FIG. 6) in the three-dimensional space. Note that "$" indicates each time point omitted herein.

In a third stage, the diagnosis part 22 generates sets of three-dimensional coordinates by combining the values of the three parameters acquired in the second stage in Step S35 into sets for the respective time points. The sets of coordinates generated here are $(P_{11}, Q_{12}, R_{13})$ $(P_{21}, Q_{22}, R_{23})$, and $(P_{31}, Q_{32}, R_{33})$.

In a fourth stage, the diagnosis part 22 dots the three-dimensional space with points indicated by the sets of coordinates generated in the third stage of Step S36.

In a fifth stage, the diagnosis part 22 obtains the coordinates of a center 122 (a first figure) of a sphere 121 (FIG. 6) having the shortest radius among spheres including the three points, and sets the coordinates of the center 122 as a "representative normal point".

Figure 6:
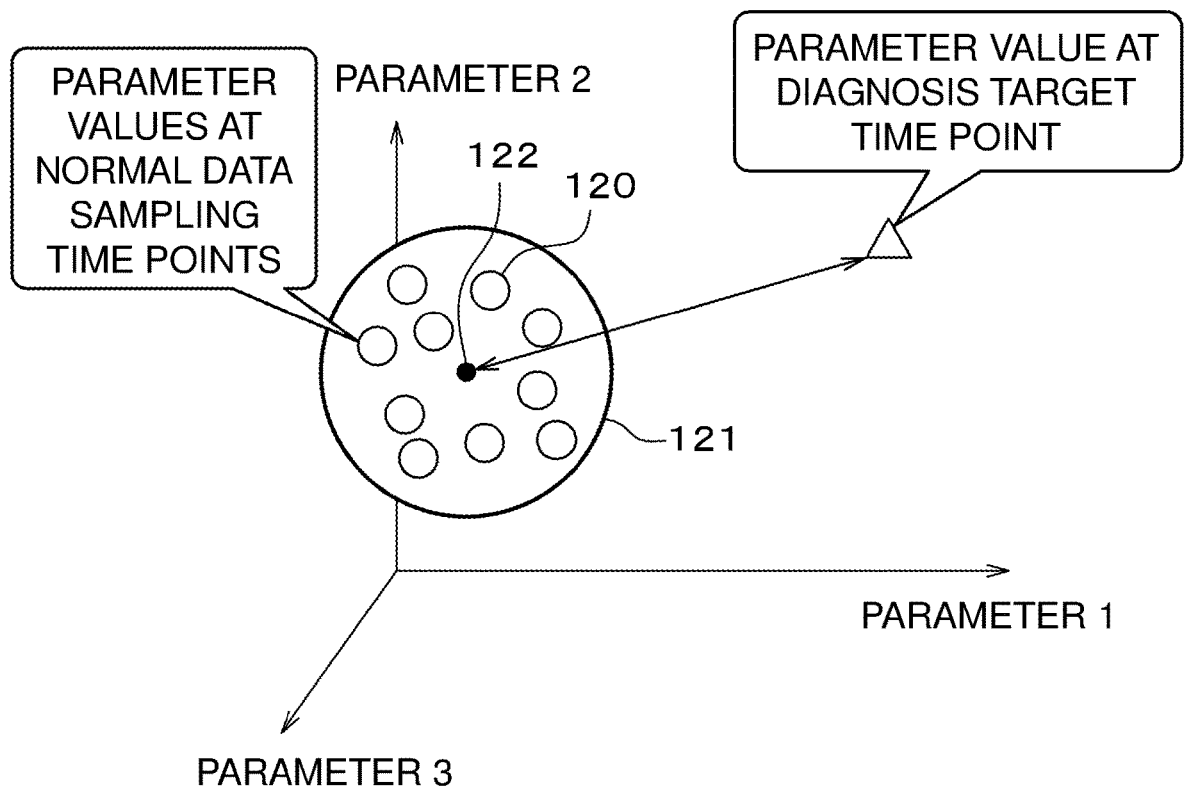
FIG. 6 is a diagram illustrating a distance in a multidimensional space.

The number of points 120 and the like included in the sphere 121 in FIG. 6 equals the number of time points included in the normal data sampling period. Although the number of such time points is "three" in the above example for simplification, it is actually more than three.

In Step S37, the diagnosis part 22 collects values of the diagnosis target parameters. Specifically, in a first stage, the diagnosis part 22 performs processing similar to that performed in the first stage in Step S35. To be more specific, the diagnosis part 22 acquires pre-processing sensor values $P_{n-2,0}, q_{n-2,0}, r_{n-2,0}, P_{n-1,0}, q_{n-1,0}, r_{n-1,0}, P_{n0}, q_{n0}$, and $r_{n0}$ from the records for the time points $t_{n-2}, t_{n-1}$, and $t_n$ included in the diagnosis target period in the sensor values database 31. These values correspond to $P_{s1}, Q_{s2}$, and $R_{s3}$ selected in Step S34.

In a second stage, the diagnosis part 22 performs processing similar to that performed in the second stage of Step S35. Specifically, the diagnosis part 22 acquires $P_{n-2,1}$ by performing signal processing (Fourier transform) on $p_{n-2,0}$, acquires $P_{n-1,1}$ by performing signal processing on and acquires $P_{n1}$ by performing signal processing on $p_{n0}$. Similarly, the diagnosis part 22 acquires $n_{n-2,2}$ by performing signal processing on $q_{n-2,0}$, acquires $n_{n-1,2}$ by performing signal processing on $q_{n-1,0}$, and acquires $Q_{n2}$ by performing signal processing on $q_{n0}$. Similarly, the diagnosis part 22 acquires $R_{n-2,3}$ by performing signal processing on $r_{n-2,0}$, acquires $R_{n-1,3}$ by performing signal processing on $r_{n-1,0}$, and acquires $R_{n3}$ by performing signal processing on $r_{n0}$.

In Step S38, the diagnosis part 22 generates sets of coordinates for the diagnosis target time points.

Specifically, the diagnosis part 22 generates sets of three-dimensional coordinates by combining the values of the three parameters acquired in the second stage in Step S37 into sets for the respective time points. The coordinate values generated here are $(P_{n-2,1}, Q_{n-2,2}, R_{n-2,3})$, $(P_{n-1,1}, Q_{n-1,2}, R_{n-1,3})$, and $(P_{n1}, Q_{n2}, R_{n3})$.

In Step S39, the diagnosis part 22 calculates distances. Specifically, the diagnosis part 22 dots the multidimensional space with a point indicating one of the sets of coordinates generated in Step S38, and calculates the distance between the point (indicated by "Δ" in FIG. 6, a second figure) and the representative normal point 122. The diagnosis part 22 repeats the processing in Step S39 for each set of coordinates generated in Step S38. As a result, the distance is calculated for each diagnosis target time point.

In Step S40, the diagnosis part 22 outputs diagnosis results. Specifically, in a first stage, the diagnosis part 22 converts the distances calculated in Step S39 to abnormality values using a predetermined method. The predetermined method may be any method as long as the abnormality value is larger for a longer distance. For example, the diagnosis part 22 may use the logarithm of the distance to a given base as an abnormality value, the deviation of the distance as an abnormality value, or the distance itself as an abnormality value.

In a second stage, on a coordinate plane 46 (FIG. 8) representing the abnormality value as its vertical axis and the diagnosis target time point as its horizontal axis, the diagnosis part 22 displays figures "□" each indicating a combination of an abnormality value and a diagnosis target time point, and displays a line graph connecting the figures. Since there are three diagnosis target time points $t_{n-2}, t_{n-1}$, and to in the above example, three figures "□" are displayed. When there are more diagnosis target time points, e.g., seven diagnosis target time points, seven figures "□" are displayed like on the coordinate plane 46. The abnormality value for each time point is based on the distance between a point indicating a combination of parameter values at a corresponding diagnosis target time point and a representative normal point common to all the diagnosis target time points. Thus, the line graph on the coordinate plane 46 indicates that the abnormality value is getting larger with time. Note that comparison with the existing technique will be described later under "Examination".

Thereafter, the processing procedure is ended.

(Details of Step S34)

After Step S33, the parameter selection part 21 have acquired the following candidate parameters:

$P_{s1}, P_{s2}, P_{s1}, \ldots$ as results of signal processing on the sensor value $p_{s0}$, $Q_{s1}, Q_{s2}, Q_{s3}, \ldots$ as results of signal processing on the sensor value $q_{s0}$, $R_{s1}, R_{s2}, R_{s3}, \ldots$ as results of signal processing on the sensor value $r_{s0}$, $V_{s1}, V_{s2}, V_{s3}, \ldots$ as results of signal processing on the sensor value $v_{s0}$, and $W_{s1}, W_{s2}, W_{s3}, \ldots$ as results of signal processing on the sensor value $w_{s0}$.

To select from the candidate parameters $P_{s1}$ and the like (narrow them down to) a given number of parameters that are truly suitable as parameters is the processing to be performed by the parameter selection part 21 in Step S34. For simplification, the following describes an example where the parameter selection part 21 narrows the candidate parameters down to three parameters. Note that the existing technique completely lacks the processing in Steps S31 to S34 of the present embodiment, and relies on the individual's knowledge and skills for the narrowing down of the parameters.

Figure 5:
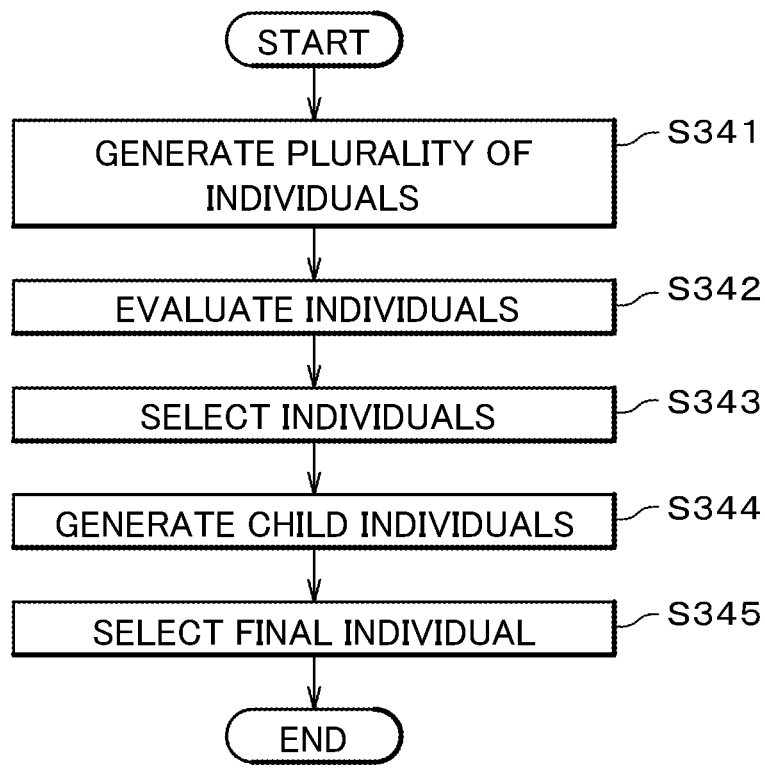
FIG. 5 is a flowchart of details of Step S34 in the processing procedure.

With reference to FIG. 5, Step S34 in the processing procedure will be detailed. The following uses a genetic-algorithm term "individual" to mean a "combination of candidate parameters" in the present embodiment.

In Step S341, the parameter selection part 21 generates a plurality of individuals. Specifically, the parameter selection part 21 randomly selects three of the candidate parameters and generates one individual.

There are at least 15 candidate parameters in the above example. However, for simplification, the following assumes that there are 15 candidate parameters. In that case, $_{15}C_3$=455 individuals are generated by the selection of three candidate parameters from 15 candidate parameters. This group of 455 individuals is called a "current generation".

Figure 7:
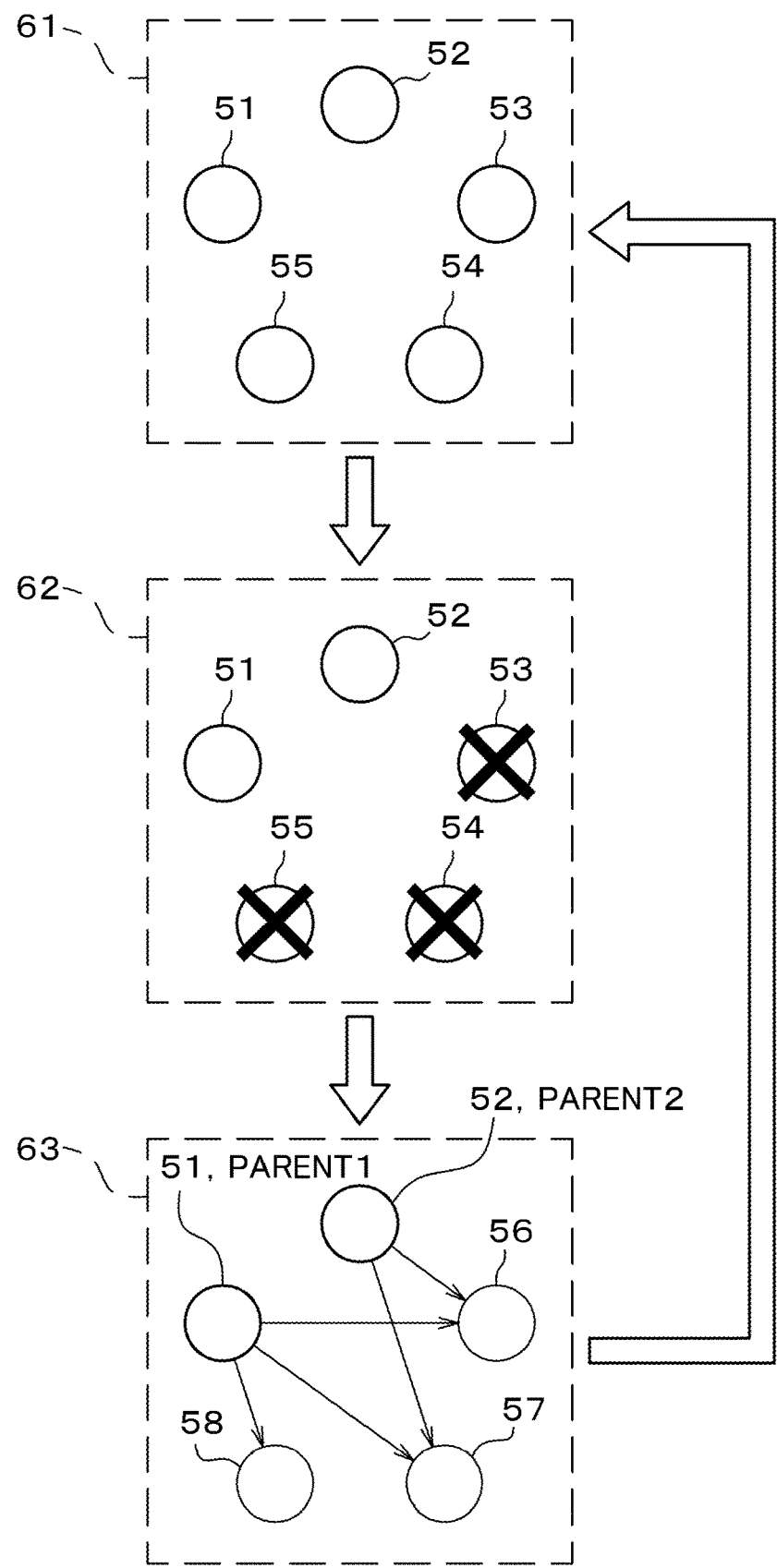
FIG. 7 is a diagram illustrating a genetic algorithm.

In FIG. 7, the current generation is represented by individuals 51 to 55 inside a frame 61. Although 455 individuals should really be depicted, only five of them are depicted for the reason of space restrictions.

In Step S342, the parameter selection part 21 evaluates the individuals. Specifically, in a first stage, the parameter selection part 21 receives, from the user, a selection of any one of evaluation functions displayed in an evaluation function field 45 on the main screen 41.

In a second stage, the parameter selection part 21 uses the selected evaluation function to calculate an evaluation value (to be described immediately below) for each of the individuals.

The parameter selection part 21 has the following evaluation functions $F_1$, $F_2$, $F_3$, and $F_4$ prepared as the evaluation functions. For each of the evaluation functions $F_1$, $F_2$, $F_3$, and $F_4$, an input variable thereto is the values of three candidate parameters in one individual and an output variable therefrom is an evaluation value.

(Processing Using Evaluation Function $F_1$)

The parameter selection part 21 dots a multidimensional space with a point indicating the combination of three candidate parameters, calculates the distance from the point to the aforementioned representative normal point, and converts the calculated distance to an evaluation value using the aforementioned predetermined method. Naturally, the parameters represented by the respective coordinate axes of the multidimensional space are different for each individual. Then, the position of the representative normal point and the position of the point indicating the combination of three candidate parameters are different for each individual, as well.

Note that the evaluation value obtained using the evaluation function $F_1$ is essentially the same as the aforementioned abnormality value. However, the term evaluation value is used here to clarify that it is an output variable from an evaluation function for evaluating suitability as a parameter.

Figure 9A:
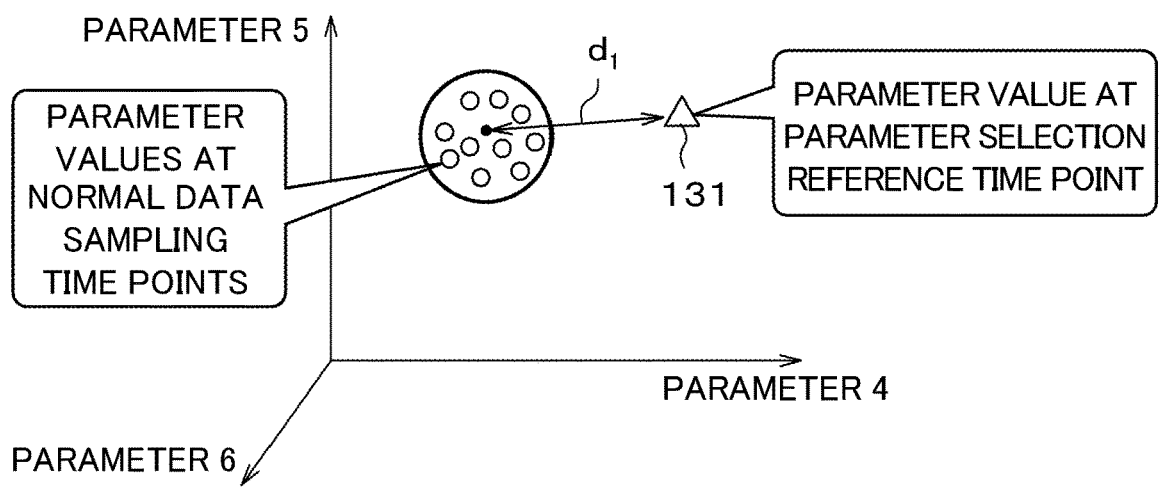
FIGS. 9A, 9B, and 9C are diagrams illustrating how the distance changes when an individual changes.
Figure 9B:
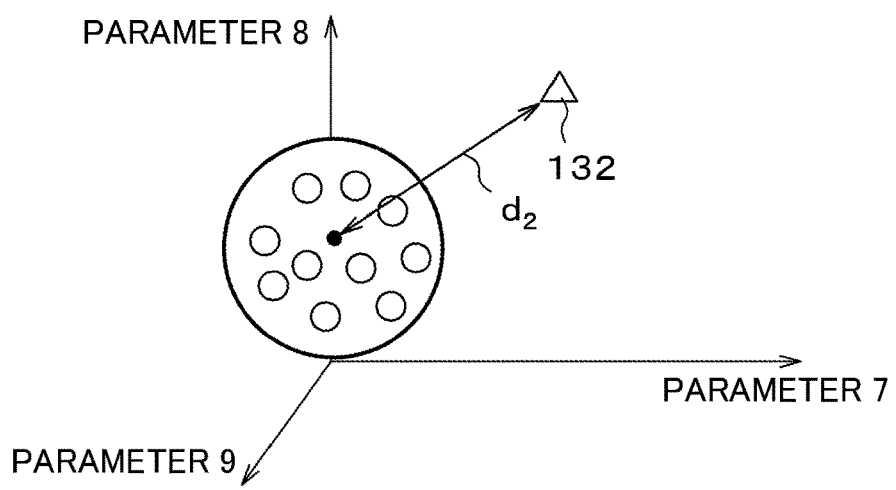
Figure 9C:
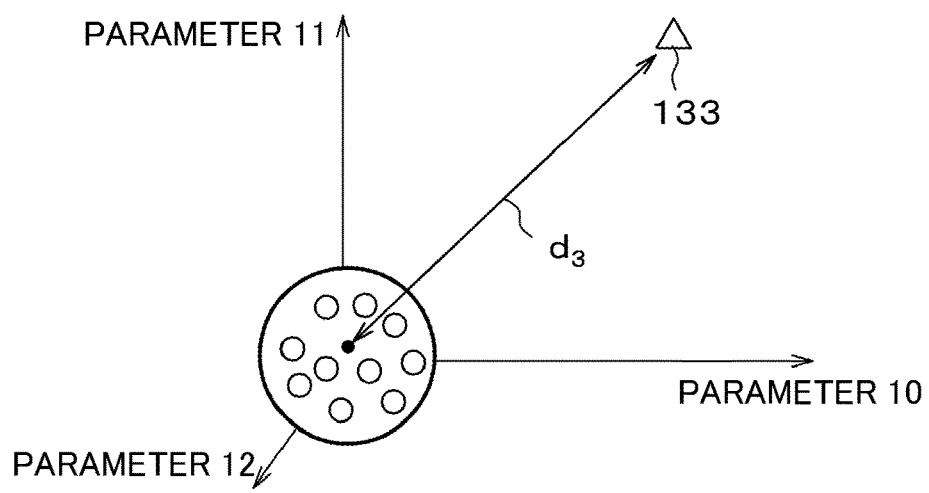

With reference to FIGS. 9A to 9C, a description is given of an example of calculating an evaluation value for each individual using the evaluation function $F_1$. In FIG. 9A, the parameters of an individual 131 are a parameter 4, a parameter 5, and a parameter 6, which correspond to the respective coordinate axes of a three-dimensional space. An evaluation value for the individual 131 is calculated based on a distance $d_1$. In FIG. 9B, the parameters of an individual 132 are a parameter 7, a parameter 8, and a parameter 9, which correspond to the respective coordinate axes of a three-dimensional space. An evaluation value for the individual 132 is calculated based on a distance $d_2$. In FIG. 9C, the parameters of an individual 133 are a parameter 10, a parameter 11, and a parameter 12, which correspond to the respective coordinate axes of a three-dimensional space. An evaluation value for the individual 133 is calculated based on a distance $d_3$.

It is apparent from FIGS. 9A, 9B, and 9C that the radius of the sphere, the position of the representative normal point, and the position of the individual "Δ" vary. It is also apparent that the distances d have a relation such that $d_1<d_2<d_3$. The fact that $d_3$ is the longest of all the distances means that the combination of the parameter 10, the parameter 11, and the parameter 12 is most suitable for predictive diagnosis (i.e., deterioration appears most distinctly as a change in parameter values).

(Processing Using Evaluation Function $F_2$)

The parameter selection part 21 acquires many sample values in the normal data sampling period for each candidate parameter, and calculates their average and dispersion. Then, based on the average and dispersion calculated, the parameter selection part 21 calculates a deviation of each candidate parameter included in the individual. Note that the deviation here is different from the deviation of the distance in the multidimensional space described above, and is a value obtained by one-dimensional evaluation of a certain candidate parameter. For this reason, the deviation here in particular is called a "one-dimensional deviation".

The parameter selection part 21 uses the largest one of the three one-dimensional deviations as an evaluation value. Although the above says "the largest", parameters may show larger values for greater deterioration or vice versa. This is true to the evaluation function $F_3$ to be described below. To facilitate an understanding, the following takes a case as a representative example where a candidate parameter shows a larger value for greater deterioration.

(Processing Using Evaluation Function $F_3$)

The parameter selection part 21 receives, from the user, a setting of a threshold for the one-dimensional deviation for each candidate parameter. Then, the parameter selection part 21 determines, for each candidate parameter, whether its value exceeds the threshold. The parameter selection part 21 counts the number of candidate parameters exceeding their thresholds, and calculates the percentage of such candidate parameters. If there are three candidate parameters, the evaluation value can take any of four values: 0%, 33.3%, 66.6%, and 100%. If there are more candidate parameters, the evaluation value can take any of more values. The parameter selection part 21 sets such a percentage as an evaluation value.

(Processing Using Evaluation Function $F_4$)

The parameter selection part 21 acquires many sample values in the normal data sampling period for each candidate parameter, and calculates the slope of the regression line between a time elapsed since the last maintenance and inspection and the sample values. Then, for each candidate parameter, the parameter selection part 21 calculates the difference (a shift from a linear relation) obtained by subtraction of the slope of the regression line from the quotient of the value of each component divided by the time elapsed since the last maintenance and inspection. The parameter selection part 21 sets the largest of these three differences as an evaluation value.

In Step S343, the parameter selection part 21 selects individuals. Specifically, among the group of individuals of the current generation, the parameter selection part 21 leaves two of them whose evaluation values are the largest and removes the rest. In FIG. 7, the individuals 51 and 52 inside the frame 62 are left, and the individuals 53, 54, and 55 are removed.

In Step S344, the parameter selection part 21 generates child individuals. Specifically, using the following methods #1 to #3, the parameter selection part 21 generates a predetermined number of child individuals from the remaining two individuals: the individuals 51 and 52. The group of individuals thus generated is called a "second generation". Further, the individual 51 is called a parent 1, and the individual 52 is called a parent 2.

(#1: Crossover)

The parent 1 makes a copy of a part of the candidate parameter and passes the copy to a child. The parent 2 makes a copy of a remaining part of the candidate parameter that the parent 1 does not pass to the child, and passes the copy to a child. This way, the parent 1 and the parent 2 generate a predetermined number of children (individuals 56, 57, and 58 inside the frame 63 in FIG. 7). Neither of the parent 1 and the parent 2 passes the same part of its parameters to a plurality of children. In other words, the plurality of children have different pieces of genetic information from one another. This applies to #2 as well.

(#2: Mutation)

The parent 1 randomly replaces a part (preferably one or two) of its candidate parameters with a different candidate parameter, and sets it as a child. The parent 1 generates a predetermined number of children. The parent 2 does the same thing.

(#3: Cloning)

The parent 1 makes copies of all its entire candidate parameters and passes the copies to a child. The parent 2 does the same thing.

Note that beforehand, the parameter selection part 21 receives, from the user, a setting of a combination of the probability of the method #1 occurring, the probability of the method #2 occurring, and the probability of the method #3 occurring. For example, the parameter selection part 21 receives the following information: (#1, #2, #3)=(60%, 30%, 10%). Then, the parameter selection part 21 generates children of a second generation based on the probabilities received.

In Step S345, the parameter selection part 21 makes a final selection of individuals. Specifically, the parameter selection part 21 iterates the processing in Steps S342 to S344 for the second generation, the third generation, . . . , and ends the iteration once a predetermined criterion is satisfied.

Although the parameter selection part 21 selects a combination of parameters using the genetic algorithm above, this is merely an example, and the parameter selection part 21 may use other methods, such as the linear search method or the Newton's method.

(Criterion for Ending the Iteration)

Examples of the predetermined criterion are as follows.

↳1: An individual having an evaluation value greater than a predetermined threshold appears.

↳2: An evaluation value of each iteration loop converges within a predetermined range.

↳3: The number of times of the iteration reaches a predetermined threshold.

↳4: The time period of the iteration reaches a predetermined threshold.

In ↳1 or ↳2, the parameter selection part 21 finally selects the individual with the largest evaluation value in the generation generated right before the iteration ends.

In ↳3 or ↳4, the parameter selection part 21 finally selects the individual with an evaluation value closest to the predetermined threshold in the generation generated right before the iteration ends. Alternatively, the parameter selection part 21 prompts the user to reset the threshold for an evaluation value.

Note that the parameters finally selected are $P_{s1}$, $Q_{s2}$, and $R_{s3}$ in the above example.

As is apparent from the above, an individual that survives in the end has a sufficiently large evaluation value. This means that the individual includes a sensor value that changes greatly when deterioration progresses, and that such a sensor value is suitable as a parameter. Note that parameters finally selected may include a pre-processing sensor value. Specifically, finally-selected parameters may be a combination of $p_{s0}$, $Q_{s2}$, and $R_{s3}$. In addition, finally-selected parameters may include a plurality of post-processing sensor values originated from one sensor. Specifically, finally-selected parameters may be a combination of $P_{s1}$, $P_{s2}$, and $R_{s3}$.

(Calculation of Evaluation Values)

The evaluation functions $F_1$, $F_2$, $F_3$, and $F_4$ are merely examples. Other methods may be employed as long as the parameter selection part 21 calculates an evaluation value to serve as an index of how much a sensor value as a candidate parameter is deviated from a reference value (the "representative normal point" in the above example) at a normal data sampling time point.

(Case where there are More than One Parameter Selection Reference Time Point)

Although the above example describes a case where one time point is inputted as a parameter selection reference period, more than one time point may be inputted. In this case, the parameter selection part 21 calculates an evaluation value for each time point and selects final individuals for each time point. From those individuals, the parameter selection part 21 may further select an individual with the largest evaluation value. Further, as an input variable to an evaluation function, the parameter selection part 21 may set the average of the values of candidate parameters at a plurality of time points inputted (e.g., three time points: $t_{s-2}$, $t_{s-1}$, and $t_s$).

(Examination)

Figure 10:
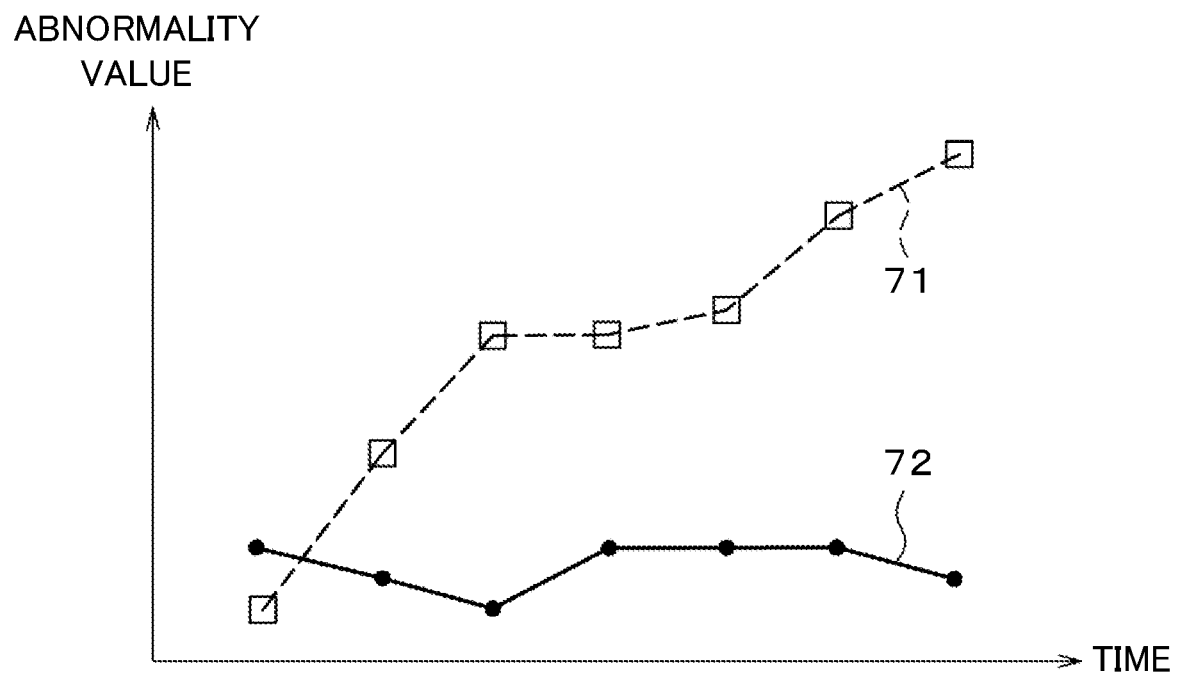
FIG. 10 is an example of examination results of abnormal values.

FIG. 10 shows results of examination of abnormality values. The coordinate plane in FIG. 10 is the same as the coordinate plane 46 in FIG. 8. Assume that the representative normal point used to calculate an abnormality value on the vertical axis is fixed at a certain point (which is not depicted in FIG. 10 but is for example the time point $t_1$ in FIG. 3). Note that the diagnosis target device actually breaks right after the seventh (far right) time point. Although not depicted in FIG. 10, the parameter selection reference time point may coincide with, for example, the fourth diagnosis target time point from the left.

The line graph 71 shows abnormality values obtained based on the genetic algorithm in Step S34 and then on calculation of the distances in Step S39. Here, the coordinate axes of a multidimensional space used for calculation of abnormality values are parameters selected as having large evaluation values. As a comparative experiment, for example, parameters determined based on an individual's knowledge and skills are used, and then, abnormality values are obtained based on the distances calculated in Step S39. The line graph 72 shows those results. The parameters used correspond to individuals of a "current generation" in the present embodiment.

The line graph 72 is almost horizontal. Meanwhile, the line graph 71 is rising on the right. This reveals the following.

(1) When parameters are selected based on an individual's knowledge and skills, abnormality values are small, and the standard has almost no relation with a diagnosis target time point.
(2) When the genetic algorithm is performed, it is more likely that the abnormality values are larger than those in (1).
(3) When the genetic algorithm is performed, the later the diagnosis target time point is, the larger the abnormality value becomes.

(The Number of Sensors and the Number of Parameters)

In the above example, one sensor acquires one type of sensor value (such as a phase current) in a time-series manner. Further, Fourier transform is performed on a sensor value at one time point (or precisely, a time point having a very short time duration), and thereby, a plurality of peak values corresponding to a plurality of frequencies may be derived from the sensor value at the one time point. These peak values may be candidate parameters.

Thus, when the number of sensors used increases, the number of types of candidate parameters drastically increases. Then, even if for example the external environment, the operation mode, or the like changes, parameters with high sensitivity with respect to normal-state data (i.e., parameters whose values change greatly with deterioration) are automatically selected from many candidates.

(Types of Sensor Values, etc.)

FIG. 1 illustrates an example where current sensors and voltage sensors are installed to measure phase currents, a zero-phase current, and phase voltages. However, the types of sensors and how they are connected are not limited to particular modes, and may be anything as long as they can measure the characteristics of the rotor 3. Other types of sensors include a vibration sensor, an acceleration sensor, and a magnetic field sensor. When a current sensor is connected to the winding start position of a coil of the feeder line 4a and the winding end position of the coil, the current sensor can measure the difference therebetween (a leak current of the feeder line 4a). When the wire connection method of the rotor 3 is Y-connection, connecting a voltage sensor to the wire connection location allows measurement of a neutral voltage.

(Types of Signal Processing)

Although Fourier transform is used as an example of signal processing in the above description, the signal processing is not limited to Fourier transform. Other examples of signal processing include wavelet transform, Laplace transform, smoothing, noise removal, data thinning, frequency filtering, and effective-value conversion. In other words, any signal processing may be employed as long as it can process a sensor value measured by a sensor into another value.

(Distance within Multidimensional Space)

Although the diagnosis part 22 uses cluster analysis for learning of the normal state and learning of the state of a diagnosis target when calculating the distance between a representative normal point and a combination of parameter values at a diagnosis target time point, the diagnosis part 22 may use other unsupervised leaning methods such as principal component analysis or a self-organizing map. Here, "unsupervised" means that data at a time point where the rotor 3 is known to be abnormal is not used.

(Operation on Sensor values Before or After Signal Processing: Part 1)

The parameter selection part 21 may perform an operation on a plurality of sensor values after signal processing, and set the result as a candidate parameter. For example, assume that a first sensor value at a certain time point is a leak current p of the feeder line 4a and a second sensor value at the time point is a phase voltage q of the feeder line 4a. The parameter selection part 21 acquires a peak value P at a certain frequency by performing Fourier transform on p and acquires a peak value Q at a certain frequency by performing Fourier transform on q. Then, the parameter selection part 21 may set the quotient of P divided by Q as a candidate parameter.

(Operation on Sensor Values Before or After Signal Processing: Part 2)

The parameter selection part 21 may perform an operation on a plurality of sensor values before signal processing, and set a value obtained by signal processing on the result of the operation as a candidate parameter. For example, assume that a first sensor value at a certain time point is a phase current p of the feeder line 4a, a second sensor value at the time point is a phase current q of the feeder line 4b, and a third sensor value at the time point is a phase current r of the feeder line 4c. The parameter selection part 21 may add q and r to p, perform Fourier transform on the sum to acquire a peak value at a certain frequency, and set the peak value as a candidate parameter.

(Operation on Sensor Values Before or After Signal Processing: Part 3)

The parameter selection part 21 may combine Part 1 and Part 2 described above. For example, assume that a first sensor value at a certain time point is a phase current p of the feeder line 4a, a second sensor value at the time point is a phase current q of the feeder line 4b, and a third sensor value at the time point is a phase current r of the feeder line 4c. Further, a fourth sensor value at the time point is a phase voltage v of the feeder line 4a, a fifth sensor value at the time point is a phase voltage w of the feeder line 4b, and a sixth sensor value at the time point is a phase voltage z of the feeder line 4c. The parameter selection part 21 adds q and r to p and acquires a peak value P at a certain frequency by performing Fourier transform on the sum, and further, adds w and z to v and acquires a peak value Q at a certain frequency by performing Fourier transform on the sum. Then, the parameter selection part 21 may set the quotient of P divided by Q as a candidate parameter.

As another example, assume that a first sensor value at a certain time point is a leak current p of the feeder line 4a, a second sensor value at the time point is a phase voltage q of the feeder line 4a, and a third sensor value at the time point is a neutral voltage r. The parameter selection part 21 acquires a peak value P at a certain frequency by performing Fourier transform on p. The parameter selection part 21 also acquires a peak value Q at a certain frequency by performing Fourier transform on the sum of q and r. Then, the parameter selection part 21 may set the quotient of P divided by Q as a candidate parameter. Further, the parameter selection part 21 may set the sum of P/Q acquired for each phase as a candidate parameter.

(Rotor)

Although the above describes an example where the rotor is an electric motor that uses three-phase AC power, this is merely an example. The rotor may be an electric motor that uses power other than three-phase AC, or a power generator. Further, the rotor may be a rotating body other than an electric motor, such as a steam turbine, a vehicle axle, or a shaft.

Advantageous Effects of the Present Embodiment

Advantageous effects of the rotor diagnostic apparatus of the present embodiment are as follows.

(1) The rotor diagnostic apparatus can properly select parameters that contribute to diagnosis results from a plurality of candidates by making effective use of sensor values of the rotor up to the diagnosis target time point.

(2) The rotor diagnostic apparatus performs signal processing on sensor values, and thus can detect abnormality that cannot be detected with only the sensor values themselves. Further, even if a sensor value at a certain one time point contains an outlier or noise, influence by such sensor value can be reduced.

(3) The rotor diagnostic apparatus can detect abnormality that appears at a particular frequency using an existing application for Fourier transform.

(4) The rotor diagnostic apparatus can use an existing application for cluster analysis, principal component analysis, and a self-organizing map.

(5) The rotor diagnostic apparatus can directly use sensor values that are typically acquired when the rotor is an electric motor, such as a phase current, a zero-phase current, a leak current, a phase voltage, a neutral voltage, and vibration.

(6) The rotor diagnostic apparatus uses the genetic algorithm, and thus can achieve high-speed and accurate processing.

(7) The rotor diagnostic apparatus iterates the genetic algorithm until the evaluation value reaches a predetermined threshold, and therefore ensures the quality of selected parameters.

(8) The rotor diagnostic apparatus ends the iteration once the number of times of the iteration reaches a predetermined threshold, and therefore avoids wasteful usage of computer resources.

It should be noted that the present invention is not limited to the embodiment described above and includes various modifications. For example, the above embodiment is described in detail to facilitate an understanding of the present invention, and the present invention does not necessarily have to include all the configurations described. Further, part of a configuration in one embodiment may be replaced by a configuration of another embodiment, or a configuration of a certain embodiment may be added to a configuration of another embodiment. Moreover, a part of configurations of each embodiment may include an additional configuration, may be deleted, or may be replaced.

Also, the configurations, functions, processing parts, processing means, and the like described above may be partially or entirely implemented by hardware by being designed as an integrated circuit, for example. Further, the configurations, functions, and the like described above may also be implemented by software by a processor interpreting and executing the programs that implement the functions. The programs for implementing the functions and information such as tables and files may be stored in a storage device such as memory, a hard disk, or an SSD (Solid State Drive) or in a storage medium such as an IC card, an SD card, or a DVD.

Further, as to control lines and information lines, only ones deemed necessary for illustration are shown, and not all the control lines and information lines that are necessary as a product are necessarily shown. It is safe to say that almost all the configurations are actually connected to one another.

REFERENCE SIGNS LIST 1 rotor diagnostic apparatus
2 power source
3 rotor
4a, 4b, 4c feeder line
5a, 5b, 5c, 5d current sensor
6a, 6b, 6c voltage sensor
11 central control device
12 input device
13 output device
14 main storage device
15 auxiliary storage device
16 sensor connection interface
21 parameter selection part
22 diagnosis part
23 input/output processing part
31 sensor values database
41 main screen

The invention claimed is:

1. A rotor diagnostic apparatus comprising:
a processor coupled to a memory;
a sensor connection interface coupled to the processor and coupled to a plurality of sensors respectively surrounding feeder lines connecting the rotor and a power source;
a memory coupled to the processor that stores instructions that when executed by the processor, configure the processor to:
perform signal processing on each sensor value a plurality of times to obtain a plurality of signal processing results for each sensor value,
determine a plurality of parameter candidates as candidates of parameters to be used for abnormality diagnosis, each parameter candidate is one of the signal processing results of each of the sensor values,
generate a plurality of individual combinations of parameter candidates, each individual combination of parameter candidate is based on a combination of two or more of the plurality of parameter candidates,
calculate evaluation values for each individual combination of parameter candidates, each evaluation value indicating how much sensor values, from the plurality of sensors, of the rotor at a given time point deviate from a reference value at a time point at which the rotor is known to be in a normal state, the given time point being after the time point at which the rotor is known to be in the normal state and before a time point at which the rotor is to be diagnosed,
remove from the plurality of individual combinations of parameter candidates at least one individual parameter candidate based on the calculated evaluation values,
thereafter generate child individual parameter candidates, which are respective generational children of the remaining individual parameter candidates and add the child individual parameter candidates to the remaining individual parameter candidates,
determine whether the remaining individual parameter candidates have an evaluation value greater than a predetermined threshold and select a plurality of parameters to be used for abnormality diagnosis of the rotor from among the plurality of remaining individual parameter candidates having an evaluation value greater than the predetermined threshold,
display, in a multidimensional space having the selected plurality of parameters as coordinate axes, a first figure represented by the sensor values corresponding to the selected plurality of parameters at the time point at which the rotor is known to be in the normal state, and a second figure represented by the sensor values corresponding to the selected plurality of parameters at the time point at which the rotor is to be diagnosed, and output an abnormality value indicative of how abnormal the rotor is, the abnormality value being based on a distance between the first figure and the second figure displayed.

2. The rotor diagnostic apparatus according to claim 1, wherein the processor is configured to:
perform signal processing on the sensor values to generate the parameter candidates,
wherein the given time point includes a plurality of time points, and
wherein the processor is configured to display the first figure represented by the sensor values for each of the plurality of time points.

3. The rotor diagnostic apparatus according to claim 2, wherein
the signal processing is Fourier transform on the sensor values.

4. The rotor diagnostic apparatus according to claim 3, wherein the processor is configured to calculate the distance by using any one of cluster analysis, principal component analysis, and a self-organizing map.

5. The rotor diagnostic apparatus according to claim 4, wherein
the rotor is an electric motor, and
the sensor values are measurement values of at least one of a phase current, a zero-phase current, a leak current, a phase voltage, a neutral voltage, and vibration.

6. The rotor diagnostic apparatus according to claim 5, wherein processor is configured to: narrow a plurality of candidate combinations of sensor values down to the plurality of parameters by using a genetic algorithm.

7. A rotor diagnostic method for a rotor diagnostic apparatus that includes a sensor connection interface coupled to the processor and coupled to a plurality of sensors respectively surrounding feeder lines connecting the rotor, the method comprising:
determine a plurality of parameter candidates as candidates of parameters to be used for abnormality diagnosis, each parameter candidate is based on a sensor value of the plurality of sensors,
generate a plurality of individual combinations of parameter candidates, each individual combination of parameter candidate is based on a combination of two or more of the plurality of parameter candidates,
calculating evaluation values for each individual combination of parameter candidates, each evaluation value indicating how much sensor values, from the plurality of sensors, of the rotor at a given time point deviate from a reference value at a time point at which the rotor is known to be in a normal state, the given time point being after the time point at which the rotor is known to be in the normal state and before a time point at which the rotor is to be diagnosed;
removing from the plurality of individual combinations of parameter candidates at least one individual parameter candidate based on the calculated evaluation values,
thereafter generating child individual parameter candidates, which are respective generational children of the remaining individual parameter candidates and add the child individual parameter candidates to the remaining individual parameter candidates,
determining whether the remaining individual parameter candidates have an evaluation value greater than a predetermined threshold and selecting a plurality of parameters to be used for abnormality diagnosis of the rotor from among the plurality of remaining individual parameter candidates having an evaluation value greater than the predetermined threshold;
displaying, in a multidimensional space having the selected plurality of parameters as coordinate axes, a first figure represented by the sensor values corresponding to the selected plurality of parameters at the time point at which the rotor is known to be in the normal state, and a second figure represented by the sensor values corresponding to the selected plurality of parameters at the time point at which the rotor is to be diagnosed, and
outputting an abnormality value indicative of how abnormal the rotor is, the abnormality value being based on a distance between the first figure and the second figure displayed.

* * * * *